United States Patent
Suzuki

(10) Patent No.: US 8,722,522 B2
(45) Date of Patent: May 13, 2014

(54) ELECTRO-STATIC DISCHARGE PROTECTION DEVICE, SEMICONDUCTOR DEVICE, AND METHOD FOR MANUFACTURING ELECTRO-STATIC DISCHARGE PROTECTION DEVICE

(71) Applicant: Fujitsu Semiconductor Limited, Yokohama (JP)

(72) Inventor: Teruo Suzuki, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/715,773

(22) Filed: Dec. 14, 2012

(65) Prior Publication Data

US 2013/0130483 A1 May 23, 2013

Related U.S. Application Data

(62) Division of application No. 12/034,173, filed on Feb. 20, 2008, now Pat. No. 8,354,723.

(30) Foreign Application Priority Data

Feb. 20, 2007 (JP) ................................. 2007-039703

(51) Int. Cl.
*H01L 21/04* (2006.01)

(52) U.S. Cl.
USPC ........................................................ 438/514

(58) Field of Classification Search
USPC .......................................... 438/514; 257/548
See application file for complete search history.

(56) References Cited

U.S. PATENT DOCUMENTS

| | | | |
|---|---|---|---|
| 5,374,565 A * | 12/1994 | Hsue et al. | .................... 438/275 |
| 5,493,142 A | 2/1996 | Randazzo et al. | |
| 5,498,887 A | 3/1996 | Ohki et al. | |
| 5,559,352 A * | 9/1996 | Hsue et al. | .................... 257/328 |

(Continued)

FOREIGN PATENT DOCUMENTS

| | | | |
|---|---|---|---|
| JP | 6-349852 A | 12/1994 | |
| JP | 9-507723 A | 8/1997 | |

(Continued)

OTHER PUBLICATIONS

USPTO, "U.S. Appl. No. 12/034,173 (pending)," [NOA] Notice of Allowance and Fees Due issued on Sep. 14, 2012.

(Continued)

*Primary Examiner* — Long K Tran
*Assistant Examiner* — Jordan Klein
(74) *Attorney, Agent, or Firm* — Fujitsu Patent Center

(57) ABSTRACT

An electro-static discharge protection device including a gate electrode formed on a substrate. First and second diffusion regions of a first conductivity type are formed in the substrate with the gate electrode located in between. A first silicide layer is formed in the first diffusion region. A silicide block region is formed between the gate electrode and the first silicide layer. A third diffusion region is formed below the first silicide layer to partially overlap the first diffusion region. The third diffusion region and first silicide layer have substantially the same shapes and dimensions. The third diffusion region and a portion below the gate electrode located at the same depth as the third diffusion region contain impurities of a second conductivity type. The third diffusion region has an impurity concentration that is higher than that of the portion below the gate electrode.

7 Claims, 10 Drawing Sheets

(56) References Cited

U.S. PATENT DOCUMENTS

| | | |
|---|---|---|
| 6,075,271 A | 6/2000 | Smith |
| 6,111,267 A | 8/2000 | Fischer et al. |
| 6,171,891 B1 * | 1/2001 | Lee et al. ............... 438/197 |
| 6,265,254 B1 * | 7/2001 | Asakura ................. 438/199 |
| 6,630,724 B1 | 10/2003 | Marr |
| 6,703,663 B1 | 3/2004 | Lee et al. |
| 6,835,985 B2 | 12/2004 | Cai et al. |
| 6,873,017 B2 | 3/2005 | Cai et al. |
| 6,891,192 B2 | 5/2005 | Chen et al. |
| 6,897,536 B2 * | 5/2005 | Nomura et al. .......... 257/403 |
| 6,900,088 B2 | 5/2005 | Nanjo et al. |
| 7,112,495 B2 * | 9/2006 | Ko et al. ................ 438/300 |
| 7,119,405 B2 * | 10/2006 | Chen et al. ............. 257/391 |
| 7,250,332 B2 | 7/2007 | Lai et al. |
| 7,492,011 B2 | 2/2009 | Suzuki et al. |
| 7,709,896 B2 * | 5/2010 | Russ et al. ............. 257/355 |
| 2005/0029601 A1 | 2/2005 | Chen et al. |
| 2005/0266631 A1 | 12/2005 | Kim et al. |
| 2006/0001097 A1 | 1/2006 | Nomura et al. |
| 2006/0273398 A1 | 12/2006 | Suzuki et al. |

FOREIGN PATENT DOCUMENTS

| | | |
|---|---|---|
| JP | 2001-308297 A | 11/2001 |
| JP | 2002-134743 A | 5/2002 |
| JP | 2004-015003 A | 1/2004 |
| JP | 2006-5204 A | 1/2006 |
| JP | 2006-19511 A | 1/2006 |

OTHER PUBLICATIONS

USPTO, "U.S. Appl. No. 12/034,173 (pending)," [CTNF] Non-Final Rejection issued on Mar. 1, 2012.

USPTO, "U.S. Appl. No. 12/034,173 (pending)," [CTNF] Non-Final Rejection issued on Aug. 21, 2009.

USPTO "U.S. Appl. No. 12/034,173 (pending)," [CTFR] Final Rejection issued on Apr. 14, 2010.

* cited by examiner

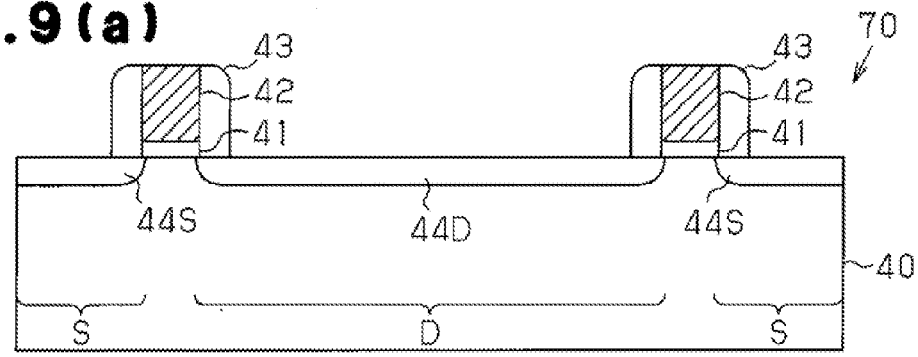
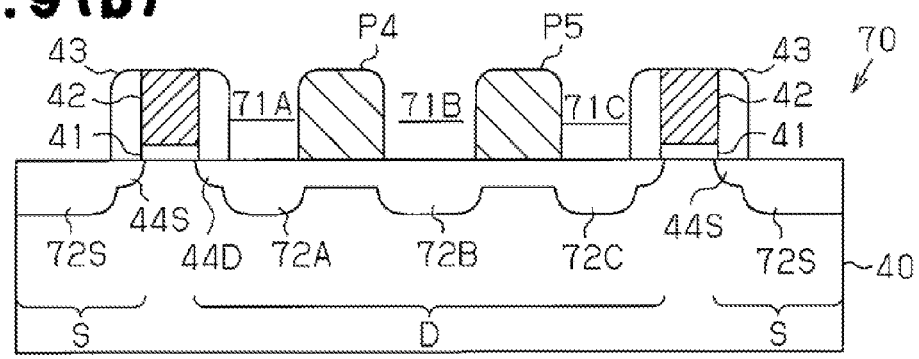
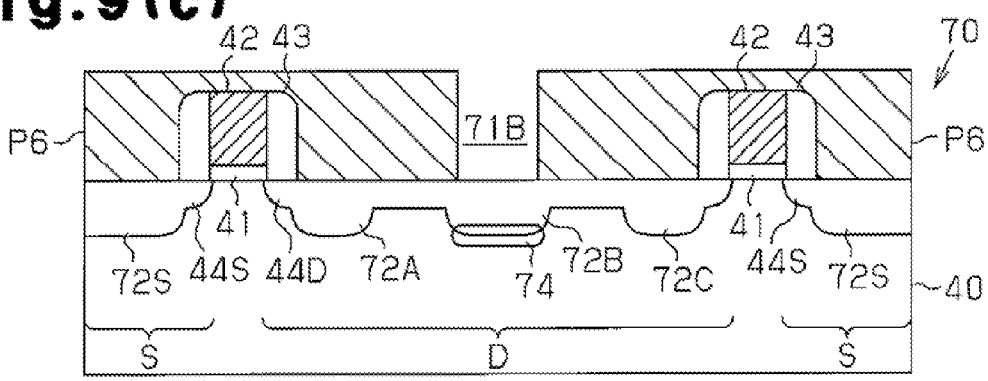
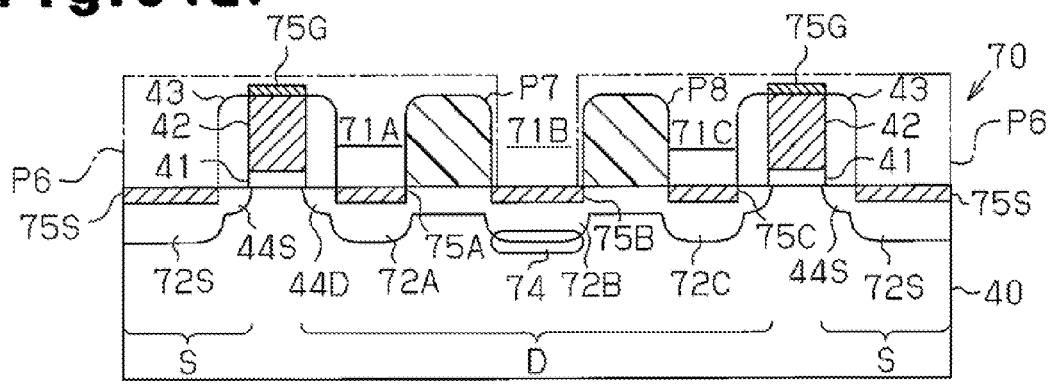

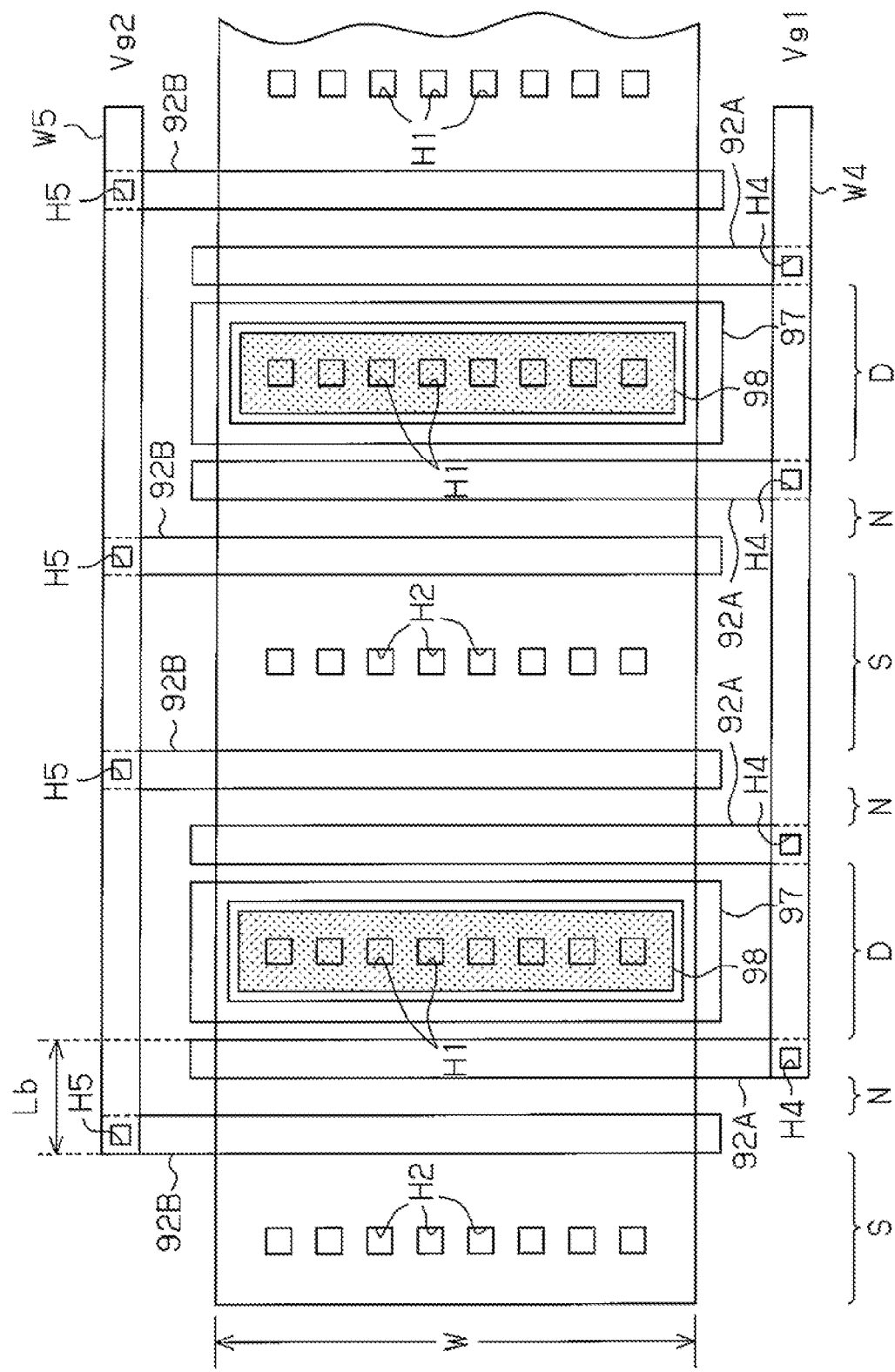

ELECTRO-STATIC DISCHARGE PROTECTION DEVICE, SEMICONDUCTOR DEVICE, AND METHOD FOR MANUFACTURING ELECTRO-STATIC DISCHARGE PROTECTION DEVICE

CROSS-REFERENCE TO RELATED APPLICATIONS

This application is a Divisional of application Ser. No. 12/034,173, now U.S. Pat. No. 8,354,723, filed on Feb. 20, 2008, which is based upon and claims the benefit of priority from the prior Japanese Patent Application No. 2007-039703, filed on Feb. 20, 2007, the entire contents of which are incorporated herein by reference.

BACKGROUND OF THE INVENTION

1. Field

The present disclosure relates to a semiconductor device, and more specifically, to a semiconductor device including an electro-static discharge protection device.

2. Description of the Related Art

A typical semiconductor device includes an electro-static discharge (ESD) protection circuit to protect semiconductor elements from an external ESD surge. The formation of a $p^+$ diffusion region in a drain region at a deep portion of a substrate is known as a method for enhancing ESD robustness of an electro-static discharge element in an ESD protection circuit. In this known example, however, the AC characteristics vary during normal operation of an IO cell depending on the accuracy of the $p^+$ diffusion region formation process. Accordingly, there is a demand for an ESD protection circuit having fixed AC characteristics and increased ESD.

In a prior art semiconductor device, a single gate electro-static discharge element is used to protect an input/output circuit from electro-static discharge. FIGS. 1 to 3 show a semiconductor device including an ESD-protection-driver circuit employing the single gate electro-static discharge element of the prior art.

As shown in FIG. 1, a semiconductor device 100 includes an input/output pad 110 coupled to an internal circuit 120 by wiring W10. The input/output pad 110 is also coupled to an ESD-protection-driver circuit 130 by the wiring W10. The ESD protection circuit/drive circuit 130 includes a plurality of single gate electro-static discharge elements M10 that are coupled in parallel to one another. Each electro-static discharge element M10 includes a ballast resistor R and an N-channel MOS transistor T10, which is coupled in series with the ballast resistor R.

Referring to FIG. 2, the single gate electro-static discharge element M10 includes a gate electrode 142 arranged on a substrate 140 of $p^-$ silicon or the like by way of a gate oxidation film. A source region 145S and a drain region 145D including $n^+$ diffusion regions are formed in the substrate 140 with the gate electrode 142 located in between. A source electrode 150 and a drain electrode 151 including silicide layers are respectively formed on the surfaces of the source region 145S and the drain region 145D. The drain electrode 151 is spaced apart from the gate electrode 142. A silicide block region 152, which does not include a silicide layer, is formed between the drain electrode 151 and the gate electrode 142. The silicide block region 152 serves as the ballast resistor R.

As shown in FIG. 3, the drain electrode 151 of each transistor T10 is coupled to metal wiring W1 through contact holes H1. The metal wiring W1 is coupled to the input/output pad 110. The source electrode 150 of each transistor T10 shown in FIG. 2 is coupled to metal wiring W2 through contact holes H2 as shown in FIG. 3. A ground potential Vss is applied to the metal wiring W2. The gate electrode 142 of each transistor T10 of FIG. 2 is coupled to metal wiring W3 through a contact hole H3 in FIG. 3. A gate voltage Vg is applied to the gate electrodes 142 via the metal wiring W3. The wiring of the gate voltage Vg may be coupled to the wiring of the ground potential Vss or an output terminal of a pre-buffer.

A case in which an ESD surge having a positive polarity is applied to the input/output pad 110 of FIG. 2 will now be discussed. In this case, the potential at the drain region 145D of the transistor T10 rises and causes an avalanche breakdown at the pn junction surface of the drain region 145D and the $p^-$ diffusion region of the substrate 140. This forms a pair of electron holes in the pn junction surface. The positive holes move into the substrate 140 and causes a flow of discharge current Ibh1. The discharge current Ibh1 raises the substrate potential. As a result, a parasitic bipolar transistor Tp1 including the $p^-$ diffusion region, the source region 145S, and the drain region 145D becomes electrically conductive in the substrate 140. When the parasitic bipolar transistor Tp1 becomes electrically conductive, a large current (arrow C in FIG. 2) flows between the drain region 145D and the source region 145S. As a result, the ESD surge applied to the input/output pad 110 is released into the wiring of the ground potential Vss to prevent the application of an ESD surge having positive polarity to the internal circuit 120. Furthermore, the potential at a common node does not significantly decrease due to the ballast resistor R even if one of the plurality of single gate electro-static discharge elements M10 becomes electrically conductive first. This prevents the current indicated by arrow C from concentrating at the single gate electro-static discharge element M10 that first becomes electrically conductive. Accordingly, when an ESD occurs in the ESD-protection-driver circuit 130, the parasitic bipolar transistor Tp1 becomes electrically conductive in all of the single gate electro-static discharge elements M10 that are coupled in parallel. This enables efficient discharging.

In this manner, the ESD robustness of the single gate electro-static discharge element M10 is increased by the silicide block region 152, that is, the ballast resistor R. However, the parasitic bipolar transistor Tp1 does not become electrically conductive until high voltage is applied to the single gate electro-static discharge element M10. This may result in the ESD damaging the internal circuit 120 before the ESD-protection-driver circuit 130 operates. Thus, there is a demand for an ESD protection circuit that starts to operate at a lower voltage.

Japanese Laid-Open Patent Publication No. 2004-15003 describes one example of an ESD protection circuit for solving such a problem. Such ESD protection circuit includes a $p^+$ diffusion region formed immediately below the drain region 145D of each transistor T10 to partially overlap part of the drain region 145D in the depthwise direction. The $p^+$ diffusion region is formed by injecting boron ion ($B^+$) so that the impurity concentration of the p+ diffusion region becomes higher than that of the substrate 140. A depletion layer is formed in the pn junction surface of the drain region 145D and the $p^+$ diffusion region. This depletion layer is narrower than a depletion layer that is formed in the pn junction surface of the drain region 145D and the $p^-$ diffusion region of the substrate 140. In such a configuration, an avalanche breakdown is likely to occur at the pn junction surface of the drain region 145D and the $p^+$ diffusion region. This lowers the voltage that starts operation of the parasitic bipolar transistor.

SUMMARY OF THE INVENTION

One aspect of the present disclosure is an electro-static discharge protection device including a substrate and a gate electrode formed on the substrate. A first diffusion region of a first conductivity type and a second diffusion region of the first conductivity type are formed in the substrate with the gate electrode located in between. A first silicide layer is formed at a local region in a surface of the first diffusion region. The first silicide layer is electrically coupled to an electrode pad to which signal voltage is applied. A silicide block region is formed between the gate electrode and the first silicide layer. A third diffusion region is formed below the first silicide layer to partially overlap a lower end of the first diffusion region. The third diffusion region and the first silicide layer have substantially the same shapes and dimensions in a lateral direction. The third diffusion region and a portion below the gate electrode located at the same depth as the third diffusion region contain impurities of a second conductivity type that differs from the first conductivity type. The third diffusion region has an impurity concentration controlled to be higher than that of the portion below the gate electrode located at the same depth.

BRIEF DESCRIPTION OF THE DRAWINGS

FIGS. 9(a) to 9(d) are cross-sectional views illustrating a process for manufacturing a semiconductor device according to a third embodiment;

FIG. 12 is a plan view of the semiconductor device according to the fourth embodiment;

DETAILED DESCRIPTION OF THE PREFERRED EMBODIMENTS

It is found that the resistance of the ballast resistor R increases when the $p^+$ diffusion region is formed at the lower part of the drain region by injecting boron ions as in the ESD protection circuit of the publication described above. When the resistance of the ballast resistor R varies, the AC characteristics of the single gate electro-static discharge protection circuit/driver circuit changes as compared to when there is no injection of boron ions. This may result in the fabrication of a semiconductor device that does not have the desired characteristics. In such a case, circuit designing, which includes a circuit simulation, must be performed again. This increases the development cost of the semiconductor device and extends the development period. The present disclosure provides an electro-static discharge protection device in which variations of the resistance of the ballast resistor is suppressed, a semiconductor device including such an electro-static discharge protection device, and a method for manufacturing such an electro-static discharge protection device.

Representative embodiments of the present disclosure will now be described.

In the embodiment shown in FIGS. 4 to 7, a semiconductor device 1 includes an input/output pad 10 coupled to an internal circuit 20 by wiring W10. An ESD-protection-driver circuit 30 is coupled to a node between the input/output pad 10 and the internal circuit 20. The ESD-protection-driver circuit 30 includes a plurality of single gate electro-static discharge elements M1 that are coupled in parallel to one another. Each electro-static discharge element M1 includes a ballast resistor R and an N-channel MOS transistor T1, which is coupled in series to the ballast resistor R. The wiring of the gate voltage Vg may be coupled to the wiring of the ground potential Vss or the output terminal of a pre-buffer. In this disclosure, the ESD-protection-driver circuit is also referred to as an electro-static discharge protection device.

Figure 1:
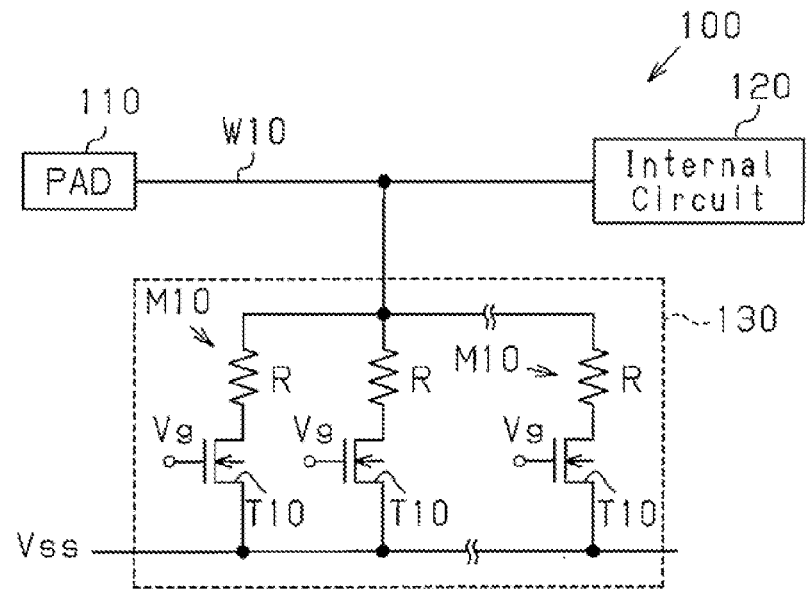
FIG. 1 is a circuit diagram of a semiconductor device in the prior art.
Figure 2:
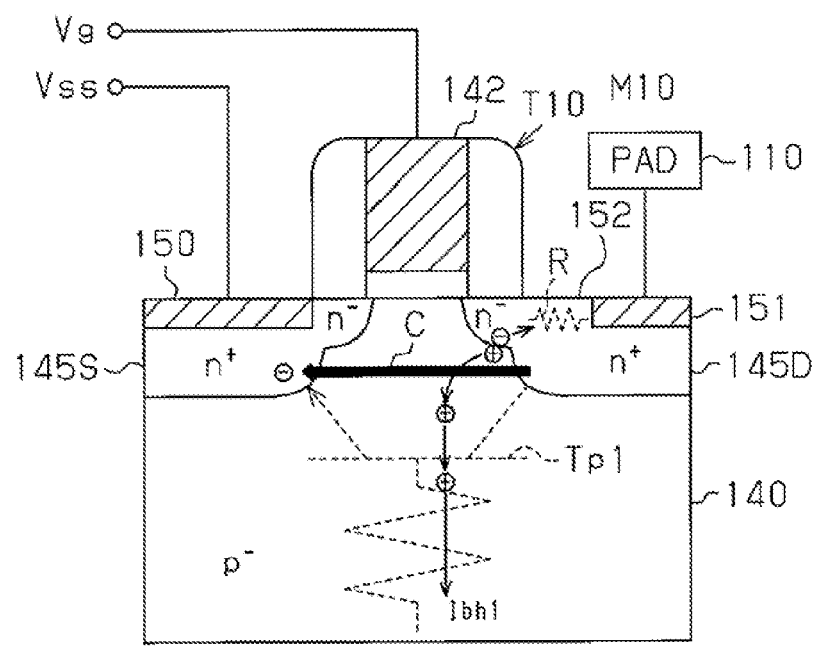
FIG. 2 is a cross-sectional view of the prior art semiconductor device.
Figure 3:
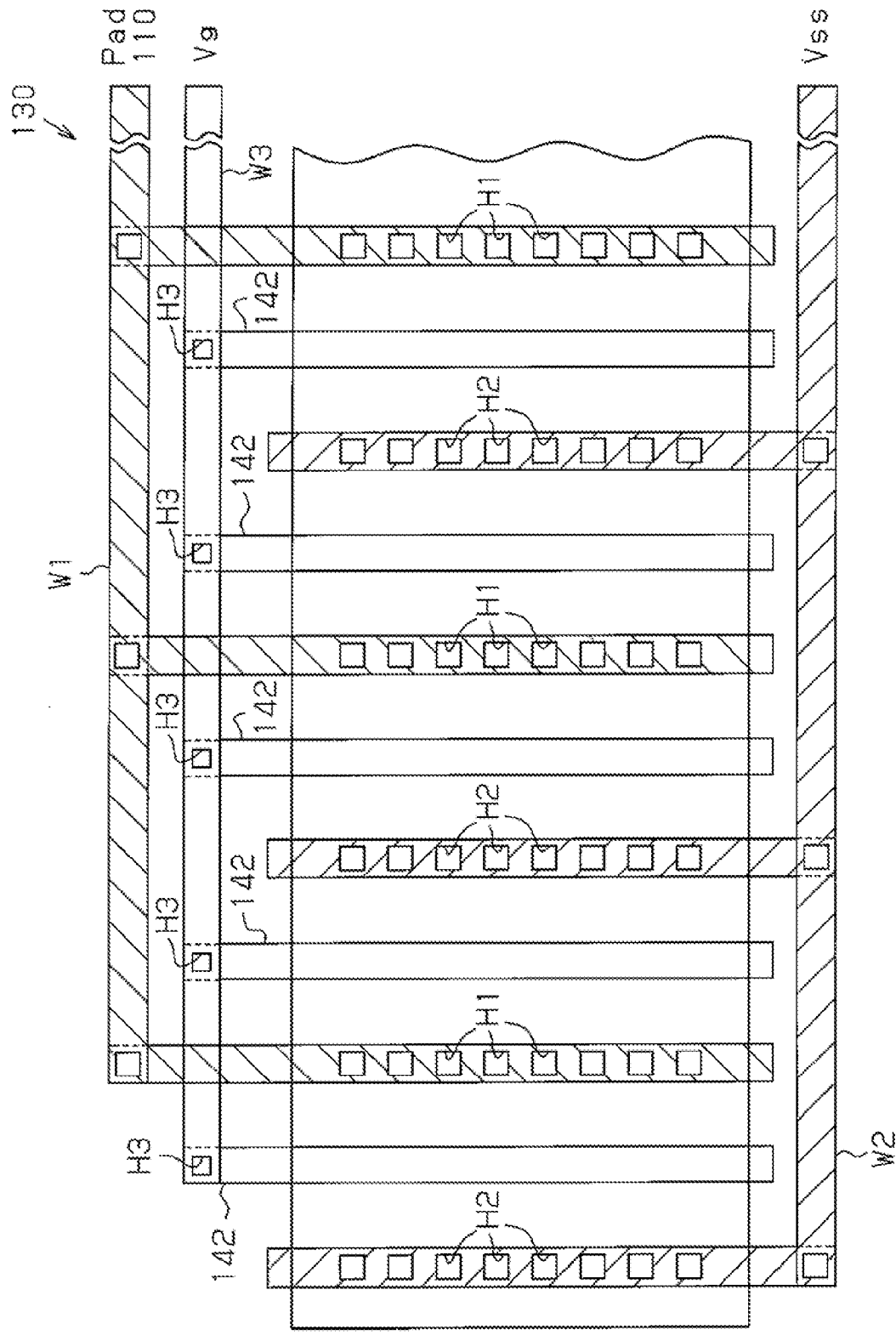
FIG. 3 is a plan view of the prior art semiconductor device.
Figure 4:
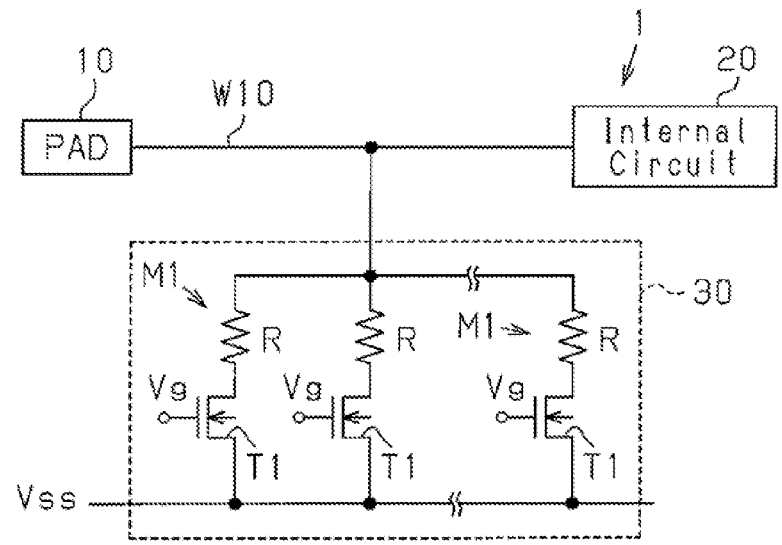
FIG. 4 is a circuit diagram of a semiconductor device according to a first embodiment.
Figure 5:
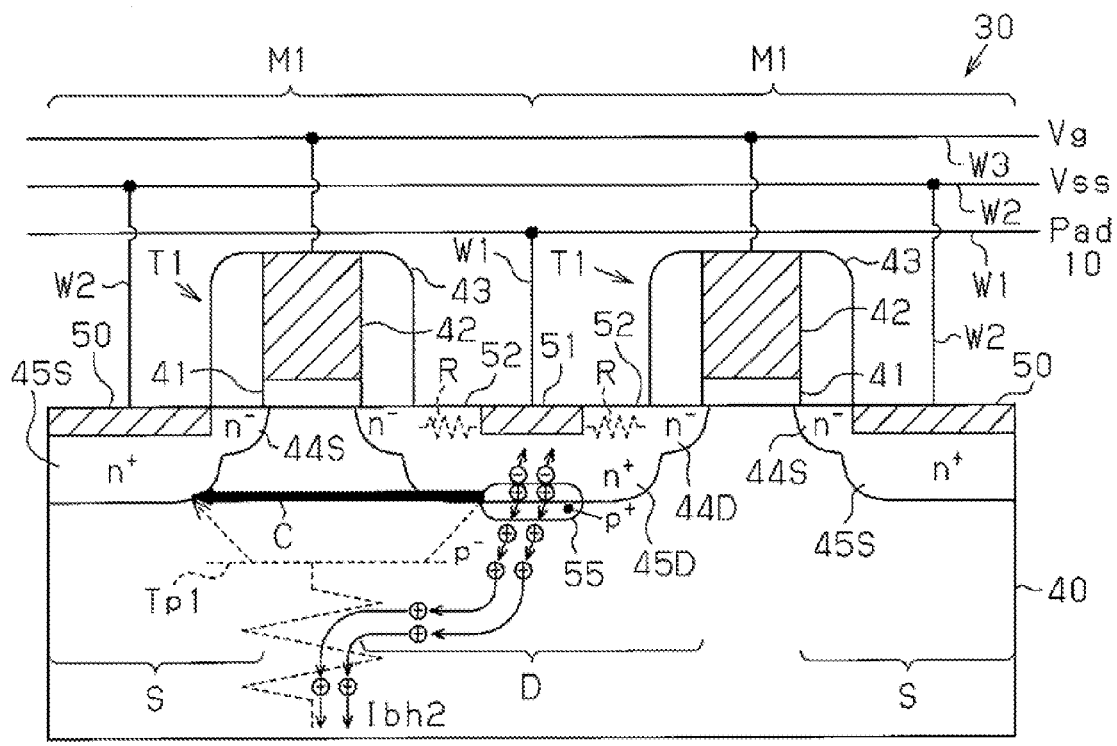
FIG. 5 is a cross-sectional view of the semiconductor device according to the first embodiment.

As shown in FIG. 5, each single gate electro-static discharge element M1 of the ESD-protection-driver circuit 30 includes a gate electrode 42 arranged on a substrate 40 of $p^-$ silicon, which is of a second conductivity type, by way of a gate oxidation film 41. The side surface of the gate electrode 42 is covered by a sidewall 43 formed by a silicon oxidation film. Lightly doped drain (LDD) regions 44S and 44D are formed by $n^-$ diffusion regions of a first conductivity type in the substrate 40 with the gate electrode 42 located therebetween. The LDD regions 44S and 44D are respectively formed in the substrate 40 at a source formation region S and a drain formation region D. An $n^+$ diffusion region 45S is formed on the inner side of each LDD region 44S. An $n^+$ diffusion region 45D is formed at the inner side of the LDD region 44D.

A source electrode 50 and a drain electrode 51 including silicide layers are formed in the surfaces of the $n^+$ diffusion regions 45S and 45D at the outer side of the sidewall 43. The source electrode 50 is formed in the entire exposed surface $n^+$ diffusion region 45S that is adjacent to the sidewall 43. The drain electrode 51 is formed in the surface of the $n^+$ diffusion region 45D spaced apart from the sidewall 43 of each gate electrode 42. A silicide block region 52, which does not include a silicide layer, is formed between the drain electrode 51 and the sidewall 43. The silicide block region 52 serves as the ballast resistor R.

Figure 6:
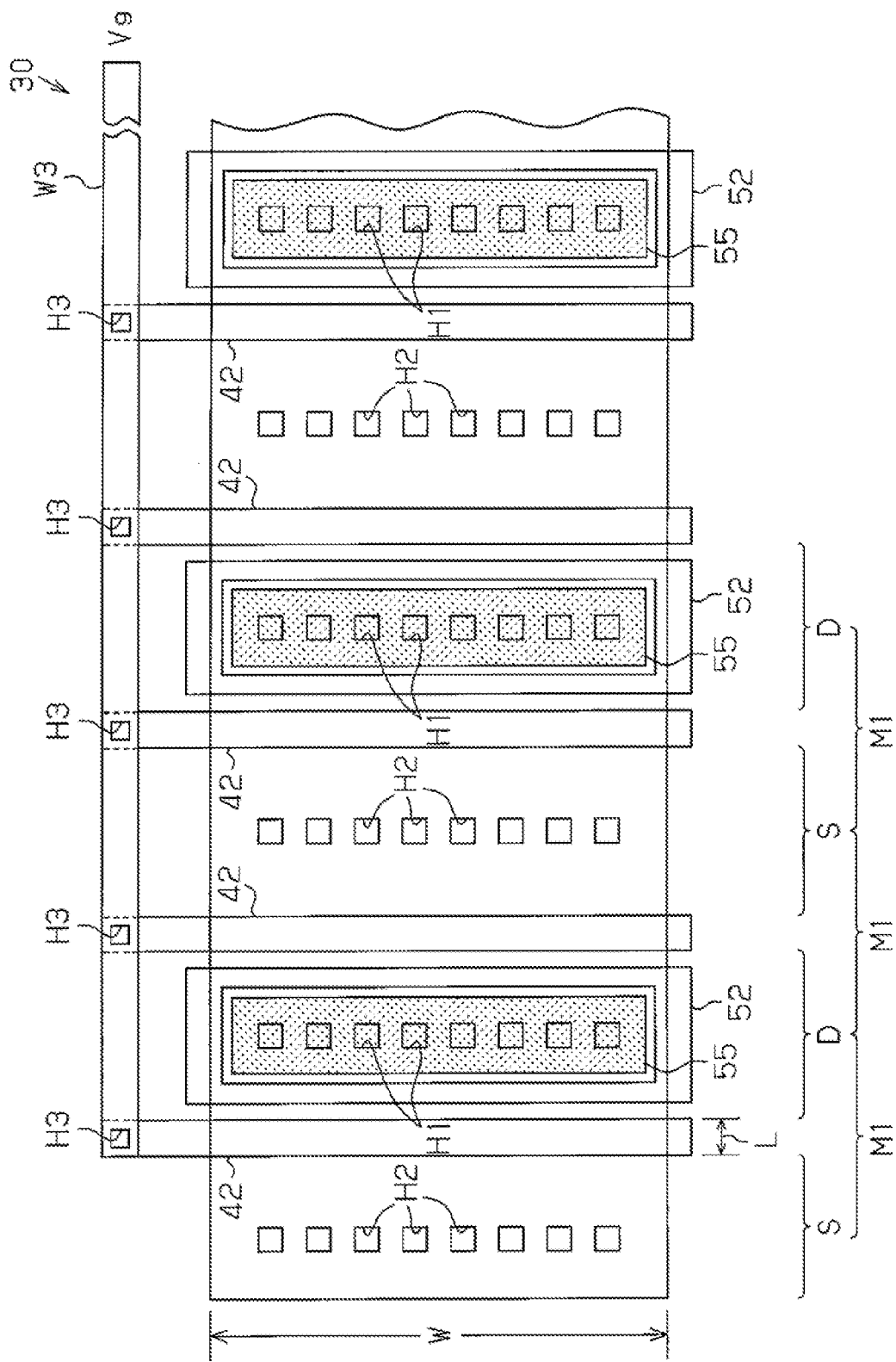
FIG. 6 is a plan view of the semiconductor device according to the first embodiment.

A $p^+$ diffusion region 55 is formed immediately below the drain electrode 51 in the lower part of the $n^+$ diffusion region 45D of the drain formation region D. As shown in FIG. 6, the $p^+$ diffusion region 55 is formed to be as wide as possible in the drain formation region D at a region excluding the lower side of the sidewall 43 and the lower side of the silicide block region 52. In the illustrated example, the $p^+$ diffusion region 55 and the drain electrode 51 have substantially the same shapes and dimensions in the lateral direction. That is, the $p^+$ diffusion region 55 is aligned with the drain electrode 51. As shown in FIG. 5, the formation depth of the $p^+$ diffusion region 55 is controlled so that the upper part of the $p^+$ diffusion region 55 overlaps the lower part of the $n^+$ diffusion region 45D. Thus, the pn junction surface of the n$^+$ diffusion region 45D and the p$^+$ diffusion region 55 exists at a relatively shallow position that is closer to the surface of the substrate 40 than before formation of the p$^+$ diffusion region 55. The p$^+$ diffusion region 55 has an impurity concentration controlled to be higher than that of the substrate 40, more specifically, below the gate electrode 42 at the same depth. Therefore, a depletion layer formed in the pn junction surface of the n$^+$ diffusion region 45D and the p$^+$ diffusion region 55 is narrower than the depletion layer in the pn junction surface of the n$^+$ diffusion region 45D and the p$^-$ diffusion region of the substrate 40.

The drain electrode 51 of each transistor T1 is coupled to metal wiring W1 through contact holes H1 (see FIG. 6), and the metal wiring W1 is coupled to the input/output pad 10. The source electrode 50 of each transistor T1 is coupled to metal wiring W2 through contact holes H2 (see FIG. 6). The ground potential Vss is applied to the metal wiring W2. As shown in FIG. 6, the gate electrode 42 of each transistor T1 is coupled to metal wiring W3 through a contact hole H3. The gate voltage Vg is applied to the gate electrode 42 via the metal wiring W3. The wiring of the gate voltage Vg may be coupled to the wiring of the ground potential Vss or the output terminal of the pre-buffer.

The operation of the semiconductor device 1 will now be discussed with reference to FIG. 5.

When ESD surge is applied to the input/output pad 10 of the semiconductor device 1 due to electro-static discharge and the like, the potential at the n+ diffusion region 45D of the transistor T1 rises, avalanche breakdown occurs at the pn junction surface of the n+ diffusion region 45D and the p+ diffusion region 55, and a pair of electron holes are formed in the pn junction surface. The holes move into the substrate 40 and generating a hole current Ibh2. The hole current Ibh2 raises the substrate potential. As a result, a parasitic bipolar transistor Tp1 including the p$^-$ diffusion region in the substrate 40, the n$^+$ diffusion region 45S, and the n$^+$ diffusion region 45D becomes electrically conductive. Since the narrow depletion layer is formed at the pn junction surface of the n+ diffusion region 45D and the p$^+$ diffusion region 55, avalanche breakdown occurs due to low voltage. Therefore, the parasitic bipolar transistor Tp1 becomes electrically conductive at a low voltage. When the parasitic bipolar transistor Tp1 becomes electrically conductive, a large current (arrow C of FIG. 5) flows between the n$^+$ diffusion region 45D and the n+ diffusion region 45S. Thus, the ESD surge applied to the input/output pad 10 is released into the wiring of the ground potential Vss to prevent the ESD surge from being applied to the internal circuit 20.

The ESD characteristics of the semiconductor device 1 will now be discussed. In a state in which the gate length L (see FIG. 6) was 0.36 μm and the gate width W (see FIG. 6) was 360 μm, the withstanding voltage was 280V before the injection of boron ions in a machine model (MM) test. The inventors have found that the withstanding voltage in the MM test improves to 360V by injecting boron ions with an energy of 60 keV while controlling the dose amount to be $3\times10^{13}$ cm$^{-2}$.

A process for manufacturing the semiconductor device 1 will now be described with reference to FIG. 7.

Figure 7A:
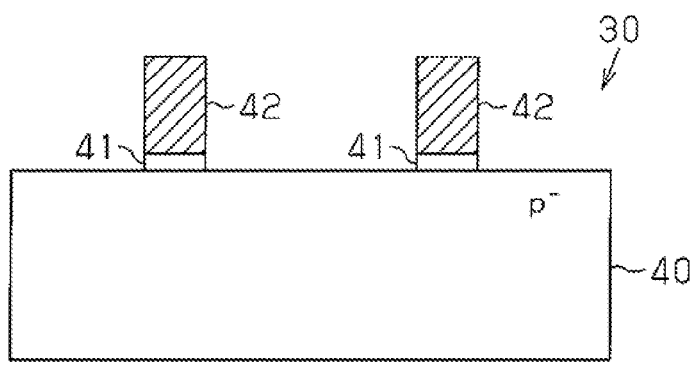
FIGS. 7(a) to 7(d) are cross-sectional views illustrating a process for manufacturing the semiconductor device according to the first embodiment.

First, referring to FIG. 7(a), shallow trench isolation (STI) is performed to form an electron isolation insulating film (not shown). Then, the surface of the substrate 40 is thermally oxidized to form the gate oxidation film 41 at a thickness of for example 8 nm. Subsequently, chemical vapor deposition (CVD) is performed to form a polycrystalline silicon film on the entire surface of the substrate 40. Photolithography and etching are then performed to pattern the polycrystalline silicon film and form the gate electrode 42.

Figure 7B:
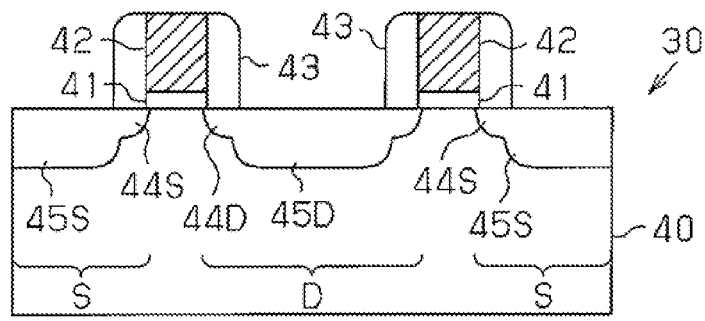

Referring to FIG. 7(b), the LDD regions 44S and 44D including n$^-$ diffusion layers are respectively formed in the source formation region S and the drain formation region D by injecting arsenic ions (As$^+$) with an energy of 10 keV while controlling the dose amount to $1\times10^{15}$ cm$^{-2}$ using the gate electrode 42 as a mask. Subsequently, CVD is performed to form a silicon oxidation film so that the entire surface has a thickness of about 130 nm, and anisotropic etching is performed on the silicon oxidation film to form the sidewall 43 of each gate electrode 42. The n$^+$ diffusion regions 45S and 45D are respectively formed in the source formation region S and the drain formation region D by injecting the phosphate ions (P$^+$) with an energy of 15 keV while controlling the dose amount at $7\times10^{15}$ cm$^{-2}$ using the gate electrode 42 and the sidewall 43 as a mask.

Figure 7C:
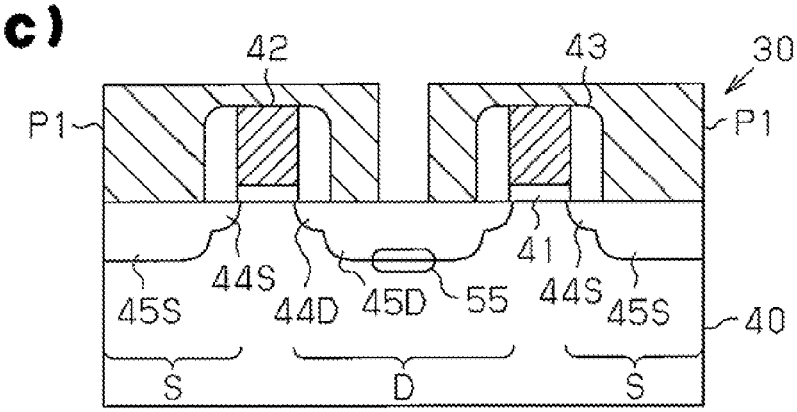

Referring to FIG. 7(c), after performing photolithography to form a film of photoresist P1 on the entire surface, the photoresist P1 is patterned to a predetermined shape. The p$^+$ diffusion region 55 is formed at the lower part of the exposed n$^+$ diffusion region 45D by injecting boron ions (B$^+$) with an energy of 60 keV while controlling the dose amount to $3\times10^{13}$ cm$^{-2}$ using the photoresist P1 patterned to the predetermined shape as a mask. In this case, the p$^+$ diffusion region 55 is formed to overlap the lower end of the above-lying n$^+$ diffusion region 45D in the depthwise direction. After ion injection, the photoresist P1 is removed, and the impurities injected into the substrate 40 are activated by performing rapid thermal annealing (RTA) at 1000° C. for about 10 seconds in a nitrogen atmosphere.

The injection of boron ions is preferably performed in a state in which a photoresist for covering the internal circuit 20 of the semiconductor device 1 is formed. This prevents an increase in the junction capacitance of the transistor (not shown) in the internal circuit 20 of the semiconductor device 1.

Figure 7D:
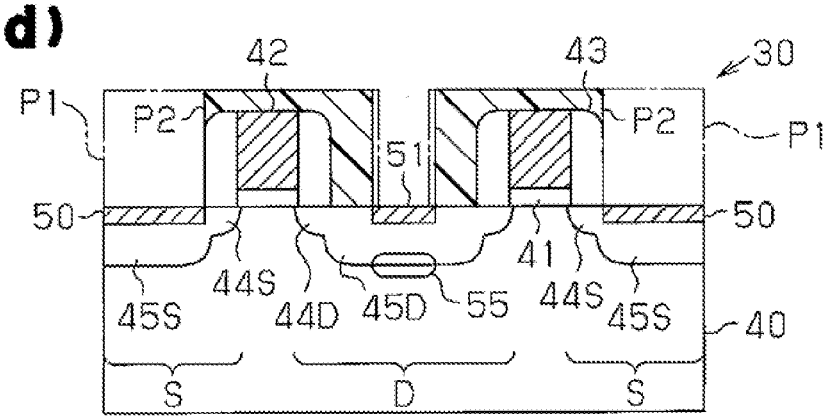

As shown in FIG. 7(d), after performing CVD to form a silicon oxidation film on the entire surface, photolithography and etching is performed to pattern the silicon oxidation film and form an oxidation film P2 serving as a silicide block that covers part of the n$^+$ diffusion region 45D and the gate electrode 42. A silicide layer is then formed on the surface of the n$^+$ diffusion regions 45S and 45D that does not include the oxidation film P2. The silicide layer formed in the surface n$^+$ diffusion region 45S of the formed silicide layer serves as the source electrode 50, and the silicide layer formed on the surface of the n$^+$ diffusion region 45D at the upper region of the p$^+$ diffusion region 55 serves as the drain electrode 51. The contact holes H1 (see FIG. 6) are formed in the upper surface of the drain electrode 51, and the drain electrode 51 is coupled to the input/output pad 10 by the metal wiring W1 formed in the contact hole H1. The contact holes H2 (see FIG. 6) are formed in the upper surface of the source electrode 50, and the source electrode 50 is coupled to the wiring of the ground potential Vss by the metal wiring W2 formed in the contact holes H2.

The n$^+$ diffusion regions 45S and 45D in the present embodiment may be omitted. In such a case, the p$^-$ diffusion region 55 is preferably formed immediately below the drain electrode 51 to contact the n$^-$ diffusion region 44D.

The source electrode 50 may be omitted. In such a case, the pattern of the oxidation film P2 must be modified so as to cover the n$^-$ diffusion region 44S of the source formation region S.

The present embodiment has the advantages described below.

(1) The p$^+$ diffusion region 55 is formed to overlap the lower part of the n$^+$ diffusion region 45D of the drain formation region D in the depthwise direction immediately below the drain electrode 51. Accordingly, the concentration gradient of the n+ diffusion region 45D formed at the lower part of the silicide block region 52 does not vary. This prevents the resistance of the ballast resistor R from varying in an optimal manner. As a result, the AC characteristics of the single gate electro-static discharge element (single gate electro-static discharge protection circuit/drive circuit) M1 are not varied. Thus, circuit simulation does not need to be performed again after the injection of boron ions. This reduces the development cost and the development time compared to the semiconductor device of the prior art.

(2) The patterns of the photoresist P1 and the oxidation film P2 are set so that the p$^+$ diffusion region 55 is formed only immediately below the drain electrode 51 and as wide as possible immediately below the drain electrode 51. Generally, the diffusion of impure ions in the lateral direction from the edges of the mask increases as the distance of the ion range becomes longer during the injection of impure ions. Accordingly, in the present embodiment, the photoresist P1 for forming the p$^+$ diffusion region 55 is applied so that the exposed portion of the drain formation region D is narrower than the oxidation film P2 for forming the drain electrode 51, as shown in FIG. 7(d), while taking into consideration the diffusion of boron ions in the lateral direction. Therefore, the p$^+$ diffusion region 55 does not enter the region immediately below the silicide block region 52 more than necessary even if boron ions are diffused in the lateral direction. As a result, the p$^+$ diffusion region 55 and the drain electrode 51 are formed immediately below the drain electrode 51 with substantially the same shapes and dimensions in the lateral direction. Furthermore, the p$^+$ diffusion region 55 is formed as wide as possible immediately below the drain electrode 51. Thus, the hole current Ibh2 shown in FIG. 5 is supplied to the substrate 40 with a low voltage. Consequently, the voltage for starting the operation of the parasitic bipolar transistor Tp1 becomes further lower.

FIG. 8 shows a method for manufacturing a semiconductor device including an ESD-protection-driver circuit 60 according to a second embodiment of the present invention. To avoid redundancy, like or same reference numerals are given to those components that are the same as the corresponding components shown in FIGS. 4 to 7. Such components will not be described in detail.

Figure 8A:
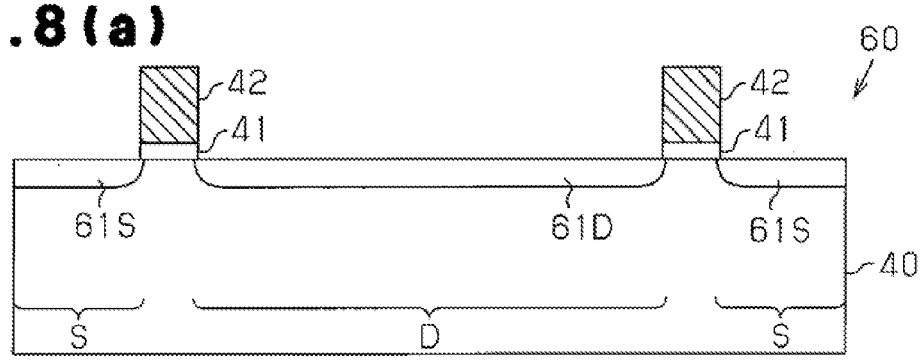
FIGS. 8(a) to 8(d) are cross-sectional views illustrating a process for manufacturing a semiconductor device according to a second embodiment.

As shown in FIG. 8(a), gate electrodes 42 are formed on the surface of a substrate 40 by way of gate oxidation films 41. N-type diffusion regions 61S and 61D are respectively formed in a source formation region S and a drain formation region D by injecting phosphate ions (P$^+$) with an energy of 30 keV while controlling the dose amount to be $3 \times 10^{13}$ cm$^{-2}$ using the gate electrodes 42 as masks.

Figure 8B:
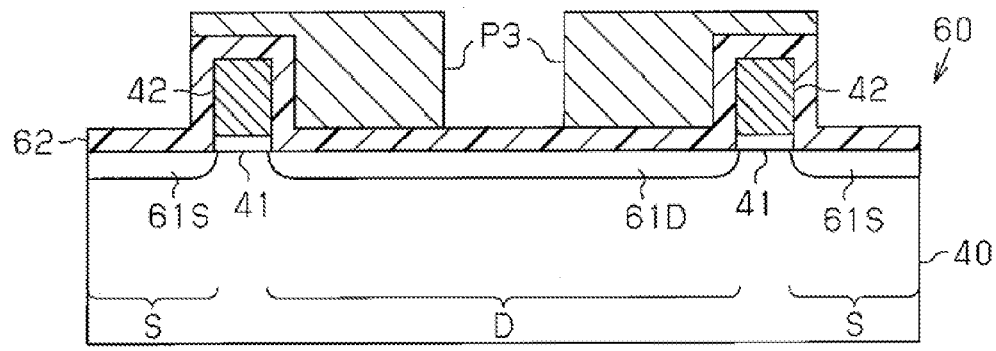
Figure 8C:
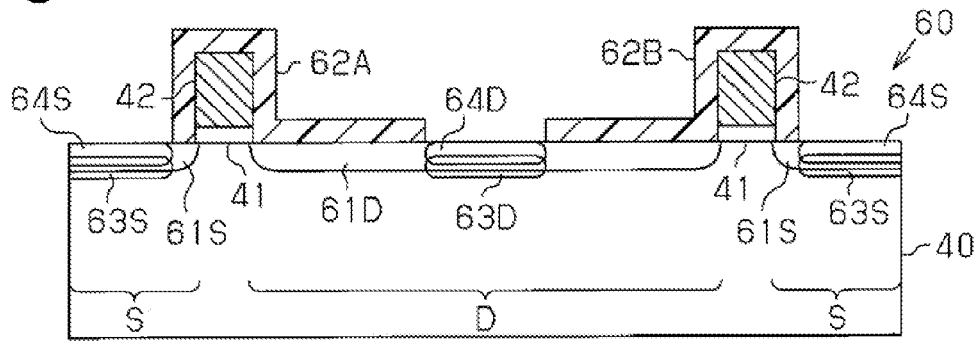

Subsequently, as shown in FIG. 8(b), CVD is performed to apply an insulation film 62, which is formed by a silicon oxidation film, on the entire surface of the substrate 40. A photoresist P3 is formed on the insulation film 62, and the insulation film 62 is patterned using the photoresist P3 as a mask to form insulation films 62A and 62B, as shown in FIG. 8(c). The insulation films 62A and 62B expose the n-type diffusion regions 61S of the source formation region S at a portion spaced apart from the gate electrodes 42 by a distance corresponding to the sidewalls. Further, the n-type diffusion region 61D of the drain formation region D is exposed at a portion spaced apart from the gate electrodes 42 by a distance corresponding to the sidewalls and the silicide block. Then, p$^+$ diffusion regions 63S and 63D are respectively formed in the exposed portions of the source formation region S and the drain formation region D by injecting boron ions with an energy of 10 keV while controlling the dose amount to be $1 \times 10^{13}$ cm$^{-2}$ using the insulation films 62A and 62B as masks. Furthermore, continuously using the insulation films 62A and 62B as masks, n$^+$ diffusion regions 64S and 64D are respectively formed in the p$^+$ diffusion region 63S and 63D at significantly shallow parts in the surface of the substrate 40 by injecting arsenic ions with an energy of 5 keV while controlling the dose amount to be $2 \times 10^{14}$ cm$^{-2}$. The p$^+$ diffusion regions 63S and 63D and n+ diffusion regions 64S and 64D are formed so as to be overlapped in the depthwise direction and so that a significantly narrow depletion layer is formed in the pn junction surface of the p$^+$ diffusion regions 63S and 63D and the n$^+$ diffusion regions 64S and 64D. Subsequently, RTA is performed to activate the impurities injected into the substrate 40.

Figure 8D:
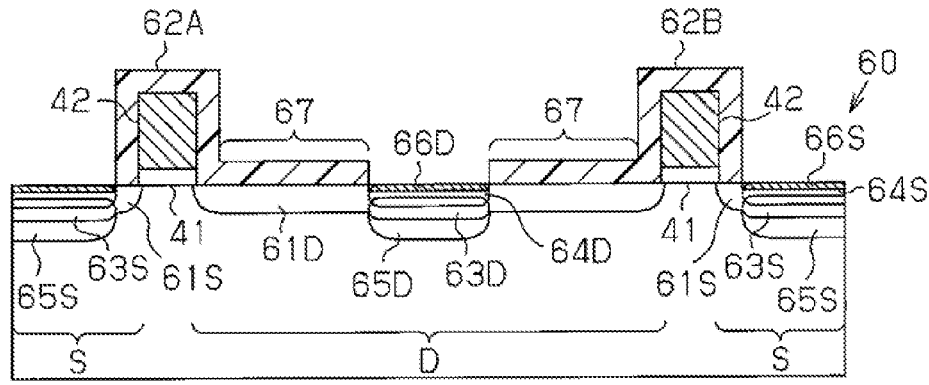

Referring to FIG. 8(d), continuously using the insulation films 62A and 62B as masks, n$^+$ diffusion regions 65S and 65D are respectively formed in the exposed portions of the source formation region S and drain formation region D by injecting phosphate ions with an energy of 15 keV while controlling the dose amount to be $2 \times 10^{15}$ cm$^{-2}$ and performing RTA at 1000° C. for 10 seconds. A source electrode 66S and a drain electrode 66D formed by silicide layers are respectively formed in the surfaces of the exposed source formation region S and the drain formation region D. The insulation films 62A and 62B are not silicided and region 67 serves as a silicide block. The silicide block is one type of ballast resistor.

The ESD-protection-driver circuit 60 is configured by coupling the drain electrode 66D to the input/output pad 10 and coupling the source electrode 66S to the wiring of the ground potential Vss. The coupling of the gate electrode will not be described here.

In the present embodiment, the n$^+$ diffusion regions 65S and 65D are formed before the formation of the silicide layer. However, the formation of the n$^+$ diffusion regions 65S and 65D may be omitted. The n$^+$ diffusion region 64S, the p$^+$ diffusion region 63S, and the source electrode 66S, which are formed in the source formation region S, in the present embodiment may be omitted. In this case, the pattern of the photoresist P3 used for patterning the insulation film 62 in FIG. 8(b) must be modified to cover the insulation film 62 formed on the source formation region S. The insulation film for covering the source formation region S is formed by performing patterning using the modified photoresist P3.

The present embodiment has the advantages described below.

(1) In the same manner as in the first embodiment, an avalanche breakdown occurs due to low voltage at the pn junction surface of the n$^+$ diffusion region 64D and the p$^+$ diffusion region 63D formed immediately below the drain electrode 66D. Thus, the voltage for starting operation of the parasitic bipolar transistor Tp1 becomes lower compared to the semiconductor device 100 of the prior art. Furthermore, the n$^+$ diffusion region 64D is formed at a significantly shallow portion in the surface of the substrate 40. This causes an avalanche breakdown more effectively than the semiconductor device 1 of the first embodiment.

(2) The insulation films 62A and 62B are commonly used as masks for forming the p$^+$ diffusion region 63D and the drain electrode 66D. The diffusion of boron ions in the lateral direction during ion injection forms the p$^+$ diffusion region 63D in some portions immediately below the silicide block region 67. However, the p$^+$ diffusion region 63D is very narrow. This prevents the resistance of the ballast resistor R from varying in a more optimal manner than the single gate electro-static discharge element M10 of the prior art. The insulation films 62A and 62B are commonly used to form the p⁺ diffusion regions 63S and 63D, the n⁺ diffusion regions 64S and 64D, the n⁻ diffusion regions 65S and 65D, the source electrode 66S, and the drain electrode 66D. This significantly reduces the number of manufacturing steps. Furthermore, since the insulation films 62A and 62B are used as the sidewalls of the gate electrodes 42 and the silicide block region 67, there is no need for a separate step for forming a sidewall on the side surface of the gate electrode 42.

FIG. 9 shows a method for manufacturing a semiconductor device including an ESD-protection-driver circuit 70 according to a third embodiment of the present invention. To avoid redundancy, like or same reference numerals are given to those components that are the same as the corresponding components shown in FIGS. 4 to 8. Such components will not be described in detail.

Referring to FIG. 9(a), gate electrodes 42 are formed on the surface of a substrate 40 by way of gate oxidation films 41. Further, LDD regions 44S and 44D are respectively formed in a source formation region S and drain formation region D using the gate electrodes 42 as masks. Sidewalls 43 are then formed on the gate electrodes 42.

Referring to FIG. 9(b), after performing photolithography to form a film of photoresist over the entire surface, the photoresist is patterned to a predetermined shape to form two photoresists P4 and P5 on the surface of the drain formation region D. The photoresists P4 and P5 are spaced apart from the sidewall 43 of each gate electrode 42. Further, the photoresists P4 and P5 are spaced apart from each other. Due to the photoresists P4 and P5, the source formation region S is exposed at a portion spaced apart from the gate electrode 42 by a distance corresponding to the sidewall 43, and three spaced exposed portions 71A, 71B, and 71C are defined in the drain formation region D. Then, n⁺ diffusion regions 72S, 72A, 72B, 72C are formed at positions corresponding to the exposed source formation region S and the exposed portions 71A to 71C by injecting phosphor ions with an energy of 15 keV while controlling the dose amount to be $7 \times 10^{15}$ cm$^{-2}$ using the photoresists P4 and P5, the gate electrodes 42, and the sidewalls 43 as masks. After performing ion injection, the photoresists P4 and P5 are removed, and the impurities injected into the substrate 40 are activated by performing rapid thermal annealing (RTA) at 1000° C. for about ten seconds in a nitrogen atmosphere.

Referring to FIG. 9(c), after performing photolithography to form a film of photoresist over the entire surface, the photoresist is patterned to a predetermined shape to form photoresist P6 exposing only the exposed portion 71B of the drain formation region D. A p⁺ diffusion region 74 is formed at the lower part of the n⁺ diffusion region 72B by injecting boron ions with an energy of 60 keV while controlling the dose amount to be $3 \times 10^{13}$ cm$^{-2}$ using the photoresist P6 as a mask. In this case, the p⁺ diffusion region 74 is formed to partially overlap the overlying n⁺ diffusion region 72B in the depthwise direction. A very narrow depletion layer is formed at the pn junction surface in the n⁺ diffusion region 72B and the p⁺ diffusion region 74. After performing ion injection, the photoresist P6 is removed, and the impurities injected into the substrate 40 are activated by performing rapid thermal annealing (RTA) at 1000° C. for about ten seconds in a nitrogen atmosphere.

As shown in FIG. 9(d), after performing CVD to form a silicon oxidation film over the entire surface, photolithography and etching are performed to pattern the silicon oxidation film is patterned to form oxidation films P7 and P8 shaped identically to the photoresists P4 and P5 shown in FIG. 9(b). Silicide layers 75G, 75S, 75A, 75B, and 75C are then formed on the surfaces of the gate electrodes 42 and in the surfaces of the substrate 40 at the exposed source formation region S and the exposed portions 71A, 71B, and 71C. The oxidation films P7 and P8 serve as silicide blocks and the region masked by the oxidation films P7 and P8 serves as a ballast resistor. The silicide layer 75B formed above the p⁺ diffusion region 74 is coupled to the input/output pad 10. That is, the silicide layer 75B formed in the exposed portion 71B serves as the drain electrode. The silicide layer 75S formed in the source formation region S is coupled to the wiring of the ground potential Vss. This forms the ESD-protection-driver circuit 70.

The present embodiment has the advantages described below.

(1) In the same manner as the first and second embodiments, an avalanche breakdown occurs due to low voltage at the pn junction surface of the n⁺ diffusion region 72B and the p⁺ diffusion region 74 formed immediately below the silicide layer 75B, which serves as the drain electrode. This lowers the voltage for starting operation of the parasitic bipolar transistor Tp1 compared to the semiconductor device 100 of the prior art.

(2) The patterns of the photoresist P6 and the oxidation films P7 and P8 are set so that the p⁺ diffusion region 74 is formed only immediately below the silicide layer 75B serving as the drain electrode as wide as possible immediately below the silicide layer 75B. That is, the patterns of the photoresist P6 and the oxidation films P7 and P8 are set to form the p⁺ diffusion region 74 with substantially the same shape and dimensions in the lateral direction as the silicide layer 75B immediately below the silicide layer 75B. This obtains the same advantages as the first embodiment.

A semiconductor device 80 including an ESD-protection-driver circuit 90 according to a fourth embodiment of the present invention will now be described with reference to FIGS. 10 to 12. To avoid redundancy, like or same reference numerals are given to those components that are the same as the corresponding components shown in FIGS. 4 to 9. Such components will not be described in detail.

Figure 10:
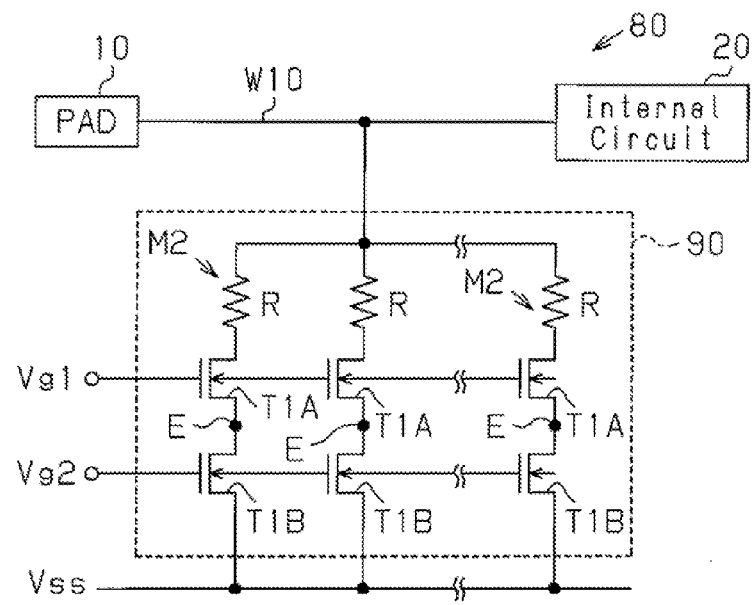
FIG. 10 is a circuit diagram of a semiconductor device according to a fourth embodiment.

As shown in FIG. 10, the semiconductor device 80 includes an input/output pad 10, an internal circuit 20, and an ESD-protection-driver circuit 90 coupled to a node between the input/output pad 10 and the internal circuit 20. The ESD-protection-driver circuit 90 includes a plurality of cascade coupled electro-static discharge elements M2, which are coupled to one another in parallel. In each cascade coupled electro-static discharge element M2, an N-channel MOS transistor T1A and an N-channel MOS transistor T1B are coupled in series, and the N-channel MOS transistors and a ballast resistor R are coupled in series.

When using the cascade coupled electro-static discharge element M2 for two types of input/output signal voltages, for example, 3.3 V and 5 V, two transistors are normally designed in correspondence with the low input/output signal voltage (e.g., 3.3 V). During use, the gate voltage Vg1 (3.3 V), which is close to the low input/output signal voltage, is applied to the gate of the transistor T1A coupled to the input/output pad. The gate of the transistor T1B of which source is coupled to the wiring of the ground potential Vss may be coupled to the wiring of the ground potential Vss or the output terminal of a pre-buffer. In such a configuration, the gate voltage Vg1 of the transistor T1A is 3.3 V even if a signal voltage of 5.0 V is applied to the input/output pad 10. Thus, the drain-gate voltage is 1.7 V and low, and the gate oxidation film of the transistor T1A will not be damaged. Therefore, the cascade coupled electro-static discharge element M2 is applicable to two types of input/output signal voltages, 3.3 V and 5.0 V.

Figure 11:
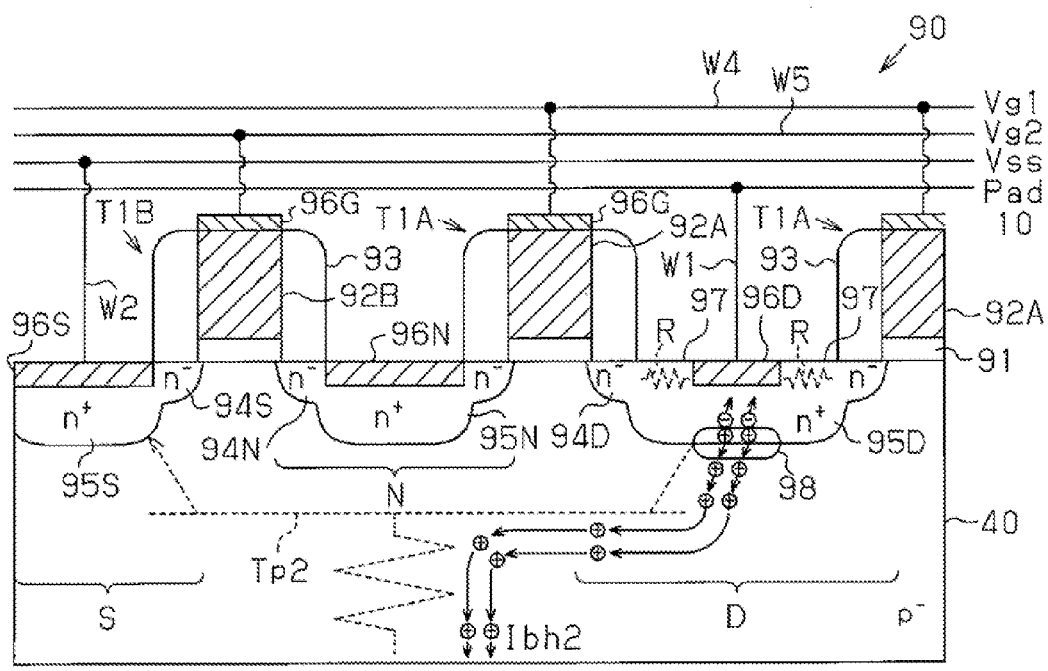
FIG. 11 is a cross-sectional view of the semiconductor device according to the fourth embodiment.

As shown in FIG. 11, the ESD-protection-driver circuit 90 includes a first gate electrode 92A of the transistor T1A and a second gate electrode 92B of the transistor T1B arranged on the substrate 40 by way of gate oxidation films 91. A silicide layer 96G is formed on the surfaces of the first and second gate electrodes 92A and 29B. A sidewall 93 is formed on each side surface of the first and second gate electrodes 92A and 92B. LDD regions 94S, 94N, and 94D formed by $n^-$ diffusion regions are formed in the substrate 40 so that the first and second gate electrodes 92A and 92B are positioned in between. The LDD regions 94S, 94N, 94D are formed in a source formation region S, a node formation region N, and a drain formation region D in the substrate 40. Further, $n^+$ diffusion regions 95S, 95N, and 95D are respectively formed at the inner side of the LDD region 94S, the inner side of the LDD region 94N, and the inner side of the LDD region 94D. The $n^+$ diffusion region 95N of the node formation region N serves as a node E (see FIG. 10) between the transistors T1A and T1B and as the drain region of the transistor T1A and the source region of the transistor T1B.

A source electrode 96S, a silicide layer 96N, and a drain electrode 96D are respectively formed in the surfaces of the $n^+$ diffusion regions 95S, 95N, and 95D entirely or partially at portions where the sidewalls 93 are not formed. Specifically, the source electrode 96S is formed in the entire exposed surface of the $n^+$ diffusion region 95S in the source formation region S adjacent to the sidewall 93 of the second gate electrode 92B. The silicide layer 96N is formed on the entire exposed surface of the $n^+$ diffusion region 95N in the node formation region N between the sidewalls 93 of the gate electrodes 92A and 92B. The drain electrode 96D is formed at a local region in the surface of the $n^+$ diffusion region 95D spaced apart from the sidewall 93 of the first gate electrode 92A. A silicide block region 97 is formed between the drain electrode 96D and the sidewall 93 where a silicide layer is not formed. The silicide block region 97 serves as the ballast resistor R.

Further, a $p^+$ diffusion region 98 is formed at the lower part of the $n^+$ diffusion region 95D in the drain formation region D in the region immediately below the drain electrode 96D. As shown in FIG. 12, the $p^+$ diffusion region 98 is formed as wide as possible in the drain formation region D at portions excluding the sidewall 93 and the silicide block region 97. In the illustrated example, the $p^+$ diffusion region 98 and the drain electrode 96D have substantially the same shapes and dimensions in the lateral direction. In other words, the $p^+$ diffusion region 98 is aligned with the drain electrode 96D. As shown in FIG. 11, the $p^+$ diffusion region 98 is formed so as to overlap the lower part of the $n^+$ diffusion region 95D in the depthwise direction. The $p^+$ diffusion region 98 has an impurity concentration that is controlled to be higher than that of the substrate 40. Therefore, a depletion layer narrower than the depletion layer at the pn junction surface of the $n^+$ diffusion region 95D and the $p^+$ diffusion region of the substrate 40 is formed in the pn junction surface of the $n^+$ diffusion region 95D and the $p^+$ diffusion region 98.

Metal wiring W1 is coupled to the drain electrode 96D of each transistor T1A through contact holes H1 (see FIG. 12), and the metal wiring W1 is coupled to the input/output pad 10. Metal wiring W2 is coupled to the source electrode 96S of each transistor T1B through contact holes H2 (see FIG. 12), and the ground potential Vss is applied to the metal wiring W2. As shown in FIG. 12, the first gate electrode 92A of each transistor T1A is coupled to metal wiring W4 through a contact hole H4, and the gate voltage Vg1 is applied to the first gate electrode 92A via the metal wiring W4. The gate voltage Vg1 is set to, for example, 3.3 V during normal operation. The second gate electrode 92B of each transistor T1B is coupled to metal wiring W5 through a contact hole H5, and the gate voltage Vg2 is applied to the second gate electrode 92B via metal wiring W5. The second gate electrode 92B of each transistor T1B may be coupled to the wiring of the ground potential Vss or the output terminal of the pre-buffer during normal operation.

The operation of the semiconductor device 80 will now be described.

When an ESD surge is applied to the input/output pad 10 of the semiconductor device 80 due to electro-static discharge or the like, an avalanche breakdown occurs at the pn junction surface of the $n^-$ diffusion region 94D and the $p^-$ diffusion region of the substrate 40 and at the pn junction surface of the $n^+$ diffusion region 95D and the $p^+$ diffusion region 98. Further, a hole current Ibh2 is supplied to the substrate 40. As a result, a parasitic bipolar transistor Tp2 including the $p^-$ diffusion region of the substrate 40, the $n^+$ diffusion region 95D of the first transistor T1A, and the $n^+$ diffusion region 95S of the second transistor T1B becomes electrically conductive. Since a narrow depletion layer is formed in the pn junction surface of the $n^+$ diffusion region 95D and the $p^+$ diffusion region 98, an avalanche breakdown occurs due to low voltage. Accordingly, the parasitic bipolar transistor Tp2 also becomes electrically conductive at a low voltage. When the parasitic bipolar transistor Tp2 becomes electrically conductive, a large current flows between the $n^+$ diffusion region 95D and the $n^+$ diffusion region 95S. This releases the ESD surge applied to the input/output pad 10 to the wiring of the ground potential Vss and prevents ESD surge from being applied to the internal circuit 20.

In the semiconductor device 80, with regard to the ESD resistance characteristics when the base length Lb (see FIG. 12) of the parasitic bipolar transistor Tp2 is 0.97 μm approximately and the gate width W (see FIG. 12) is 360 μm, the withstanding voltage was 120 V in a machine mode (MM) test before the injection of boron ions. The inventors found that the withstanding voltage improves to 280 V in the MM test by injecting boron ions with an energy of 60 keV while controlling the dose amount to be $3 \times 10^{13}$ cm$^{-2}$. The inventors also found that the withstanding voltage of 2600 V in a human body model (HBM) before injection of boron ions greatly improves the withstanding voltage to be 4000 V or higher in an HBM test after ion injection. The parasitic bipolar transistor Tp2 is configured by the $p^-$ diffusion region in the substrate 40, the $n^+$ diffusion region 95D of the first transistor T1A, and the $n^+$ diffusion region 95S of the second transistor T1B. Thus, the base length Lb becomes equal to the total value of the gate length of 0.36 μm of the first and second gate electrodes 92A and 92B and the distance of 0.25 μm of the node formation region N.

A method for manufacturing the semiconductor device 80 will now be discussed with reference to FIG. 13.

Figure 13A:
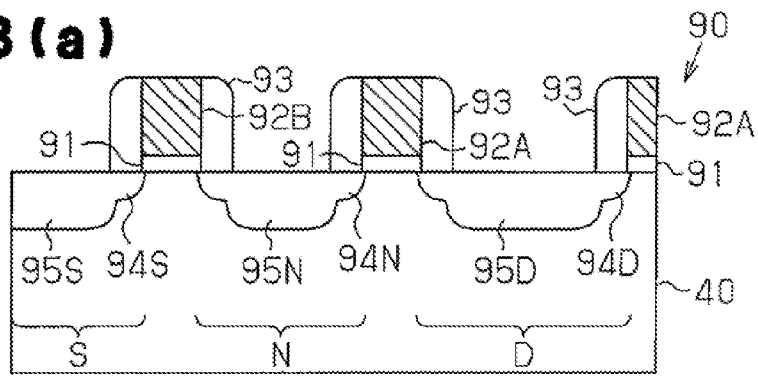
FIGS. 13(a) to 13(c) are cross-sectional views illustrating a process for manufacturing a semiconductor device according to the fourth embodiment.

First, referring to FIG. 13(a), the first gate electrode 92A and second gate electrode 92B are formed spaced apart from each other on the surface of the substrate 40 by way of the gate oxidation films 91. The LDD regions 94S, 94N, 94D are respectively formed in the source formation region S, the node formation region N, and the drain formation region D by injecting arsenic ions with an energy of 10 keV while controlling the dose amount to be $1 \times 10^{15}$ cm$^{-2}$ using the first gate electrode 92A and the second gate electrode 92B as a mask. Then, CVD is performed to form a silicon oxidation film having a thickness of about 130 nm on the entire surface. Then, anisotropic etching is performed on the silicon oxidation film to form the sidewall 93 of each gate electrode 92A, 92B. The n+ diffusion regions 95S, 95N, and 95D are respectively formed in the source formation region S, the node formation region N, and the drain formation region D by injecting phosphor ions with an energy of 15 keV while controlling the dose amount to $7 \times 10^{15}$ cm$^{-2}$ using the gate electrodes 92A and 92B and the sidewall 93 as a mask.

Figure 13B:
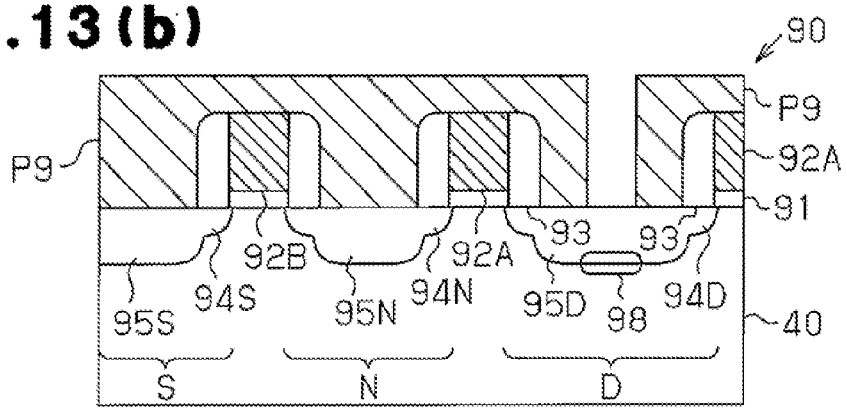

Referring to FIG. 13(b), after performing photolithography to form a film of photoresist over the entire surface, the photoresist is patterned to a predetermined shape to form a photoresist P9 exposing only part of the drain formation region D. The p+ diffusion region 98 is formed at the lower part of the n+ diffusion region 95D in the exposed drain formation region D by injecting boron ions (B+) with an energy of 60 keV while controlling the dose amount to be $3 \times 10^{13}$ cm$^{-2}$ using the photoresist P9 as the mask. In this case, the p+ diffusion region 98 is formed to overlap the lower end of the overlying n+ diffusion region 95D in the depthwise direction. After ion injection, the photoresist P9 is removed, and impurities are injected into the substrate 40 and activated by performing RTA at 1000° C. for about ten seconds in a nitrogen atmosphere.

Figure 13C:
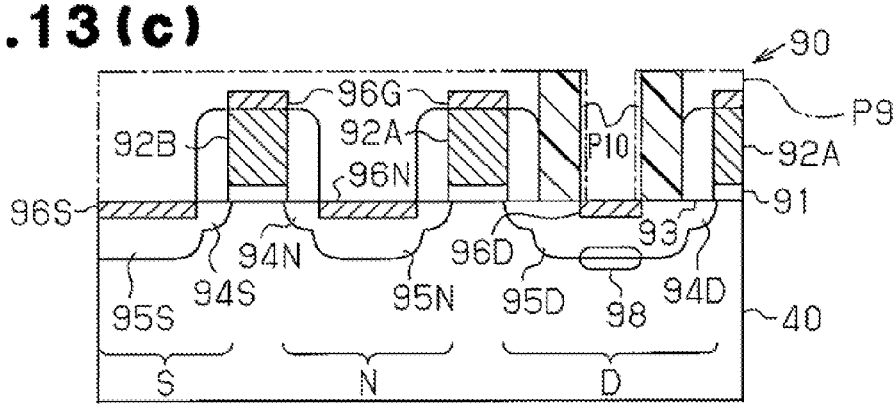

Referring to FIG. 13(c), after performing CVD to form a silicon oxidation film over the entire surface, photolithography and etching are performed to pattern the silicon oxidation film and form an oxidation film P10 serving as a silicide block for covering part of the n+ diffusion region 95D adjacent to the sidewall 93 of the first gate electrode 92A. A silicide layer is then formed on each gate electrode 92A, 92B and in the surface of the n+ diffusion regions 95S, 95N, and 95D at portions where the oxidation film P10 is not formed. The silicide layer formed on the surface of the n+ diffusion region 95S of the formed silicide layers serves as the source electrode 96S, and the silicide layer formed on the surface of the n+ diffusion region 95D at the upper region of the p+ diffusion region 98 serves as the drain electrode 96D. The contact holes H1 (see FIG. 12) are formed in the upper surface of the drain electrode 96D, and the drain electrode 96D is coupled to the input/output pad 10 by the metal wiring W1 (see FIG. 11) formed in the contact holes H1. The contact holes H2 (see FIG. 12) are formed in the upper surface of the source electrode 96S, and the source electrode 96S is coupled to the wiring of the ground potential Vss by the metal wiring W2 (see FIG. 12) formed in the contact hole H2. This forms the ESD-protection-driver circuit 70.

The present embodiment has the advantages described below.

(1) An avalanche breakdown occurs due to low voltage at the pn junction surface of the n+ diffusion region 95D and the p+ diffusion region 98 formed immediately below the drain electrode 96D. Thus, the voltage for starting operation of the parasitic bipolar transistor Tp2 becomes low.

(2) The patterns of the photoresist P9 and the oxidation film P10 are set so as to form the p+ diffusion region 98 only immediately below the drain electrode 96D and as wide as possible. In the illustrated example, the patterns of the photoresist P9 and the oxidation film P10 are set so as to form the p+ diffusion region 98 immediately below the drain electrode 96D so that the p+ diffusion region 98 and the drain electrode 96D have substantially the same shapes and dimensions in the lateral direction. Therefore, the same advantages as the first embodiment are obtained.

It should be apparent to those skilled in the art that the present invention may be embodied in many other specific forms without departing from the spirit or scope of the invention.

Figure 14:
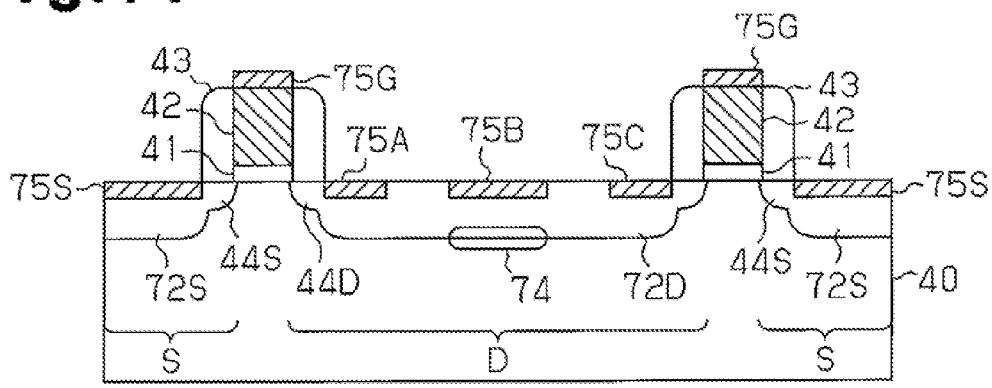
FIG. 14 is a cross-sectional view of a modified semiconductor device.

The shapes of the silicide block region and the drain electrode are not particularly limited. For example, the shape may be changed as shown in FIG. 14. FIG. 14 shows a modification of the third embodiment shown in FIG. 9. Specifically, the three n+ diffusion regions 72A, 72B, and 72C formed in the drain formation region D shown in FIG. 9 may be modified to a single n+ diffusion region 72D.

The formation of the n+ diffusion region in the drain formation region D in the first, third, and fourth embodiments may be omitted. In such cases, the p− diffusion region may be formed immediately below the drain electrode to contact the lower end of the n− diffusion region. Further, a new n+ diffusion region may be formed under the p+ diffusion region.

In the first, third, and fourth embodiments, the p+ diffusion regions 55, 74, 98 may be formed by injecting boron ions before forming the n+ diffusion regions 45D, 72B, 95D.

In the second embodiment, the insulation films 62A and 62B are used as the sidewalls of the gate electrode 42 and the side block region 67. However, the sidewalls of the gate electrode 42 and the side block region 67 may be formed separately. In such a case, it is preferred that photolithography be performed to pattern photoresist and form a mask for forming the p+ diffusion region 63D.

The silicide layer may be formed on the surface of the gate electrode 42 in the first and second embodiments. In such a case, the pattern of the oxidation film P2 must be modified to expose the gate electrode 42.

In the step of FIG. 9(d) in the third embodiment, the silicide layer may be formed separately from the oxidation film for covering the gate electrode 42. Further, the silicide layer may be formed separately from the oxidation film for covering the n− diffusion region 75S of the source formation region S.

In the step of FIG. 13(c) in the fourth embodiment, the pattern of the oxidation film P10 may be modified to cover the first and second gate electrodes 92A and 92B and the n− diffusion region 94N in the node formation region N. Alternatively, the oxidation film P10 may have the same pattern as the photoresist P9, and the silicide layer may be formed using the oxidation film P10 as a mask.

In the above embodiments, boron ions are injected to form the p+ diffusion region. However, the present invention is not limited in such a manner as long as p-type impure ions are used.

In the above embodiments, the transistors T1, T1A, T1B are N-channel MOS transistors but may be changed to P-channel MOS transistors.

The present examples and embodiments are to be considered as illustrative and not restrictive, and the invention is not to be limited to the details given herein, but may be modified within the scope and equivalence of the appended claims.

What is claimed is:

1. A method for manufacturing an electro-static discharge protection device, the method comprising:
   forming a gate electrode on a substrate;
   forming a first diffusion region and a second diffusion region in the substrate by injecting impure ions of a first conductivity type using the gate electrode as a mask, the gate electrode being located between the first diffusion region and the second diffusion region;
   forming a resist pattern to expose at a first local region in a surface of the first diffusion region, the first local region being spaced apart from a first sidewall insulation film formed on a side surface of the gate electrode;
   forming a third diffusion region under the first diffusion region in the substrate by injecting impure ions of a second conductivity type that differ from the first conductivity type using the resist pattern as a mask;

forming an insulation film so as to expose a second local region in the surface of the first diffusion region, the second local region being located above the third region and wider than the first local region; and forming a silicide layer in the exposed second local region of the first diffusion region using the insulation film as a mask.

2. The method for manufacturing an electro-static discharge protection device according to claim 1, further comprising:

forming another diffusion region of the first conductivity type below the third diffusion region by injecting impure ions of the first conductivity type using the insulation film as a mask before forming the silicide layer.

3. The method for manufacturing an electro-static discharge protection device according to claim 1, wherein:

the gate electrode includes a first gate electrode, a second gate electrode spaced apart from the first gate electrode, and a node region formed in the substrate between the first gate electrode and the second gate electrode.

4. A method for manufacturing an electro-static discharge protection device; the method comprising:

forming a gate electrode on a substrate;

forming a first diffusion region and a second diffusion region in the substrate by injecting impure ions of a first conductivity type using the gate electrode as a mask, the gate electrode being located between the first diffusion region and the second diffusion region;

forming a sidewall insulation film on a side surface of the gate electrode;

forming a fourth diffusion region and a fifth diffusion region respectively below the first diffusion region and the second diffusion region in the substrate by injecting impure ions of the first conductivity type using the gate electrode and the sidewall insulation film as a mask;

forming a resist pattern to expose a first local region in a surface of the first diffusion region, the first local region being spaced apart from the first sidewall insulation film formed on the side surface of the gate electrode;

forming a third diffusion region under the fourth diffusion region in the substrate by injecting impure ions of a second conductivity type that differs from the first conductivity type using the resist pattern as a mask;

forming an insulation film for exposing a second local region in the surface of the first diffusion region, the second local region being located above the third diffusion region and wider than the first local region; and forming a silicide layer in the exposed second local region of the first diffusion region using the insulation film as a mask.

5. The method for manufacturing the electro-static discharge protection device according to claim 4, wherein:

the gate electrode includes a first gate electrode, a second gate electrode spaced apart from the first gate electrode, and a node region formed in the substrate between the first gate electrode and the second gate electrode.

6. A method for manufacturing an electro-static discharge protection device, the method comprising:

forming a gate electrode on a substrate;

forming a first diffusion region and a second diffusion region in the substrate by injecting impure ions of a first conductivity type using the gate electrode as a mask, the gate electrode being located between the first diffusion region and the second diffusion region;

forming a first sidewall insulation film on a side surface of the gate electrode;

forming a resist pattern for exposing a local region in a surface of the first diffusion region, the local region being spaced apart from the first sidewall insulation film;

forming a third diffusion region at a location deeper than the first diffusion region by injecting impure ions of a second conductivity type that differs from the first conductivity type using the resist pattern as a mask;

forming a sixth diffusion region at a location shallower than the third diffusion region by injecting impure ions of the first conductivity type using the resist pattern as a mask;

forming an insulation film for exposing the sixth diffusion region; and forming a silicide layer in an exposed surface of the sixth diffusion region using the insulation film as a mask.

7. The method for manufacturing the electro-static discharge protection circuit according to claim 6, wherein:

the gate electrode includes a first gate electrode, a second gate electrode spaced apart from the first gate electrode, and a node region formed in the substrate between the first gate electrode and the second gate electrode.

* * * * *